(12) United States Patent
Li et al.

(10) Patent No.: US 6,177,304 B1
(45) Date of Patent: Jan. 23, 2001

(54) SELF-ALIGNED CONTACT PROCESS USING A POLY-CAP MASK

(75) Inventors: Weining Li; Yung-Tao Lin; Mau Lam Lai; Tin Tin Wee, all of Singapore (SG)

(73) Assignee: Chartered Semiconductor Manufacturing Ltd., Singapore (SG)

( * ) Notice: Under 35 U.S.C. 154(b), the term of this patent shall be extended for 0 days.

(21) Appl. No.: 09/298,933

(22) Filed: Apr. 26, 1999

(51) Int. Cl.$^7$ ............... H01L 21/8238; H01L 21/336; H01L 21/44
(52) U.S. Cl. .................. 438/233; 438/301; 438/655
(58) Field of Search ...................... 438/233, 301, 438/655

(56) References Cited

U.S. PATENT DOCUMENTS

| | | | |
|---|---|---|---|
| 5,573,980 | 11/1996 | Yoo | 437/200 |
| 5,605,853 | 2/1997 | Yoo et al. | 437/43 |
| 5,683,922 | * 11/1997 | Jeng et al. | |
| 5,719,079 | 2/1998 | Yoo et al. | 438/238 |
| 5,792,684 | * 8/1998 | Lee et al. | |
| 5,843,816 | * 12/1998 | Liaw et al. | |
| 5,874,353 | * 2/1999 | Liu et al. | |
| 5,885,895 | * 3/1999 | Liu et al. | |
| 5,899,742 | * 5/1999 | Sun | |
| 6,040,619 | * 3/2000 | Wang et al. | |

OTHER PUBLICATIONS

Wolf, "Silicon Processing for the VLSI Era", vol. 2: Process Integration, Lattice Press, Sunset Beach, CA, (1990), pp. 144–149.

Chang et al., "ULSI Technology", The McGraw–Hill Companies, Inc., NY, (1996), pp. 397–402 and 486–487.

\* cited by examiner

Primary Examiner—John F. Niebling
Assistant Examiner—Ron Pompey
(74) Attorney, Agent, or Firm—George O. Saile; Rosemary L. S. Pike

(57) ABSTRACT

A method for integrating salicide and self-aligned contact processes in the fabrication of logic circuits with embedded memory is described. Isolation areas are formed on a semiconductor substrate surrounding and electrically isolating device areas. Gate electrodes and associated source and drain regions are formed on and in the semiconductor substrate wherein the gate electrodes have silicon nitride sidewall spacers. A metal silicide layer is formed on the top surface of the gate electrodes and on the top surface of the semiconductor substrate overlying the source and drain regions associated with the gate electrodes using a salicide process. A poly-cap layer is deposited overlying the substrate. The poly-cap layer is selectively removed overlying one of the salicided source and drain regions where a self-aligned contact is to be formed, and overlying another of the salicided source and drain regions and a portion of its associated salicided gate electrode where a butted contact is to be formed. An insulating layer is deposited over the surface of the semiconductor substrate. The insulating layer is etched through to form simultaneously the planned self-aligned contact opening and the planned butted contact opening. The self-aligned contact opening and the butted contact opening are filled with a conducting layer to complete fabrication of the integrated circuit device.

20 Claims, 8 Drawing Sheets

SELF-ALIGNED CONTACT PROCESS USING A POLY-CAP MASK

BACKGROUND OF THE INVENTION (1) Field of the Invention

The present invention relates to the fabrication of integrated circuit devices, and more particularly, to a method of integrating salicide and self-aligned contact processes in the fabrication of integrated circuits.

(2) Description of the Invention

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

In the production of memory units, the self-aligned contact (SAC) has been widely used to reduce cell size, thus greatly increasing the device density for the CMOS product design. With the advent of Large Scale Integration (LSI) many of the integrated circuits formed on semiconductor substrates comprise several circuit functions on a single chip. For example, memory devices are formed on the same chip as the logic circuits which address them. It is desired to find a method of integrating the salicide and the SAC processes on one wafer so that both high logic performance and high density memory for embedded memory can be achieved.

The standard SAC process needs to use an insulator-capped polysilicon. This makes the process incompatible with the salicide process.

Silicidation has been widely used in the art. Silicidation techniques and self-aligned contacts are discussed in *Silicon Processing for the VLSI Era*, Vol. 2, by S. Wolf, Lattice Press, Sunset Beach, Calif., c. 1990, pp. 144–149 and in *ULSI Technology*, by C. Y. Chang and S. M. Sze, McGraw-Hill, New York, N.Y., c. 1996, pp.397–402 and 487–488. U.S. Pat. No. 5,573,980 to Yoo shows a method of forming a salicided SAC for an SRAM, but with no embedded logic. U.S. Pat. Nos. 5,605,853 and 5,719,079, both to Yoo et al teach formation of a 4T SRAM and floating gate memory and logic device including salicide and a butted contact, but not including a SAC.

SUMMARY OF THE INVENTION

Accordingly, it is a primary object of the present invention to provide an effective and very manufacturable method for integrating salicide and self-aligned contact processes in the fabrication of integrated circuits It is a further object of the invention to provide a process for integrating salicide and self-aligned contact processes in the fabrication of logic circuits with embedded memory.

Yet another object is to form salicided gate and source/drain regions in the logic circuits of an integrated circuit device while also forming self-aligned contacts in the memory circuits of the same integrated circuit device.

Yet another object of the invention is to form salicided gate and source/drain regions in the logic circuits of an integrated circuit device while also forming simultaneously a self-aligned contact and a butted contact in the memory circuits of the same integrated circuit device.

A still further object of the invention is to form simultaneously a self-aligned contact and a butted contact in the fabrication of an integrated circuit device.

In accordance with the objects of the invention, a method for integrating salicide and self-aligned contact processes in the fabrication of logic circuits with embedded memory is achieved. Isolation areas are formed on a semiconductor substrate surrounding and electrically isolating device areas. Gate electrodes and associated source and drain regions are formed on and in the semiconductor substrate wherein the gate electrodes have silicon nitride sidewall spacers. A metal silicide layer is formed on the top surface of the gate electrodes and on the top surface of the semiconductor substrate overlying the source and drain regions associated with the gate electrodes using a salicide process. A poly-cap layer is deposited overlying the substrate including the salicided gate electrodes and source and drain regions. The poly-cap layer is selectively removed overlying one of the salicided source and drain regions where a self-aligned contact is to be formed, and overlying another of the salicided source and drain regions and a portion of its associated salicided gate electrode where a butted contact is to be formed. An insulating layer is deposited over the surface of the semiconductor substrate. The insulating layer is etched through to form simultaneously the planned self-aligned contact opening and the planned butted contact opening. The self-aligned contact opening and the butted contact opening are filled with a conducting layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention is a SAC process that can be plugged in easily into the standard salicide logic process. By introducing a polysilicon capping mask into the process, the contact space to polysilicon can be pushed to zero and a butting contact can be fabricated in the same step as the self-aligned contact. This process is fully compatible with the salicide process, although it does not have to be used in conjunction with a salicide process, without any impact on device performance. The first preferred embodiment of the invention details the inventive SAC process within the salicide process. The second preferred embodiment describes the SAC of the invention in a non-salicide process.

Figure 1:
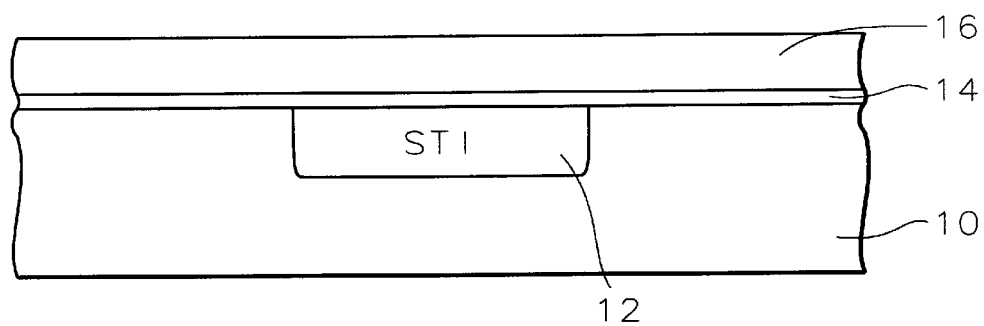
FIGS. 1 through 3 are cross-sectional representations of a preferred embodiment of the present invention.

The first few steps are the same for both preferred embodiments of the present invention and will be described with reference to FIGS. 1–3. Referring now more particularly to FIG. 1, there is shown a semiconductor substrate 10, preferably composed of monocrystalline silicon. Isolation regions such as field oxide or shallow trench isolation (STI) regions 12 may be formed as is conventional in the art to isolate active device regions from one another.

A layer of gate oxide 14 is grown over the surface of the substrate, typically to a thickness of between about 40 and 100 Angstroms. A layer of polysilicon 16 is deposited over the gate oxide and field oxide regions to a thickness of between about 1000 and 3000 Angstroms.

Figure 2:
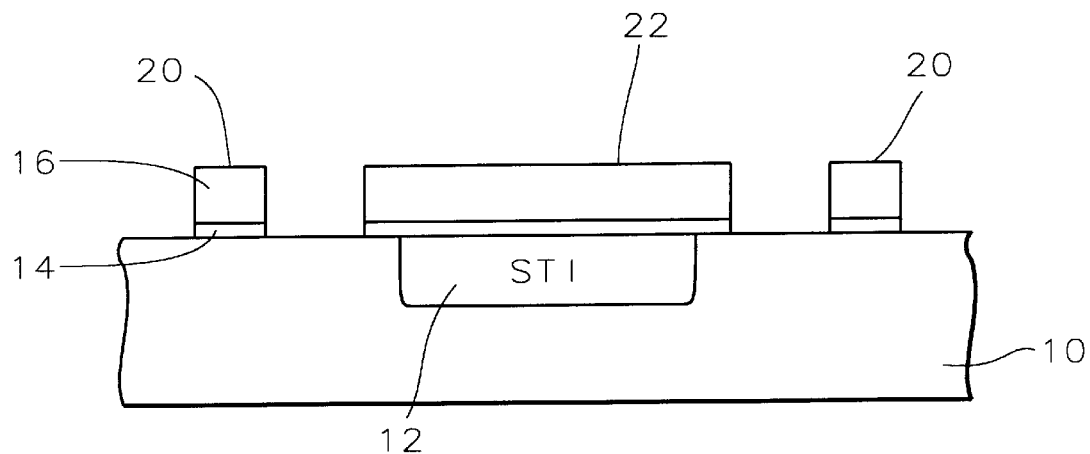
Figure 3:
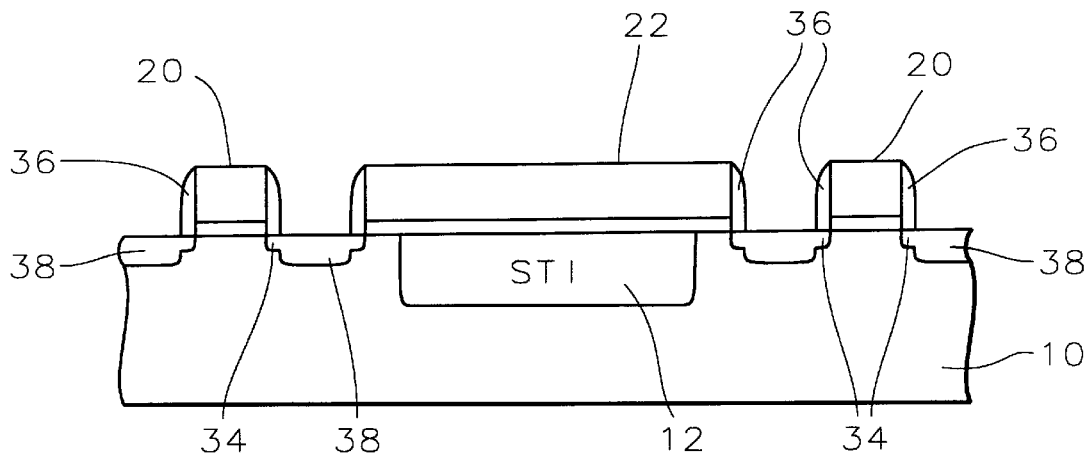

The polysilicon and gate oxide layers are etched away where they are not covered by a mask to form the gate electrodes 20 and 22, as shown in FIG. 2. These gate electrodes may be memory devices, such as word lines in a dynamic random access memory (DRAM) cell or pass-gate or pull-down transistors in a static random access memory (SRAM) cell.

The LDD implant to form the transistor lightly doped regions 34 is performed at this time. Both NLDD and PLDD regions are formed using appropriate photomasking, as is conventional. A layer of silicon nitride is deposited over the surface of the substrate and anisotropically etched back to leave silicon nitride spacers 36 on the sidewalls of the gate electrodes 20 and 22. Ion implantations are performed to form heavily doped source and drain regions 38.

Figure 4:
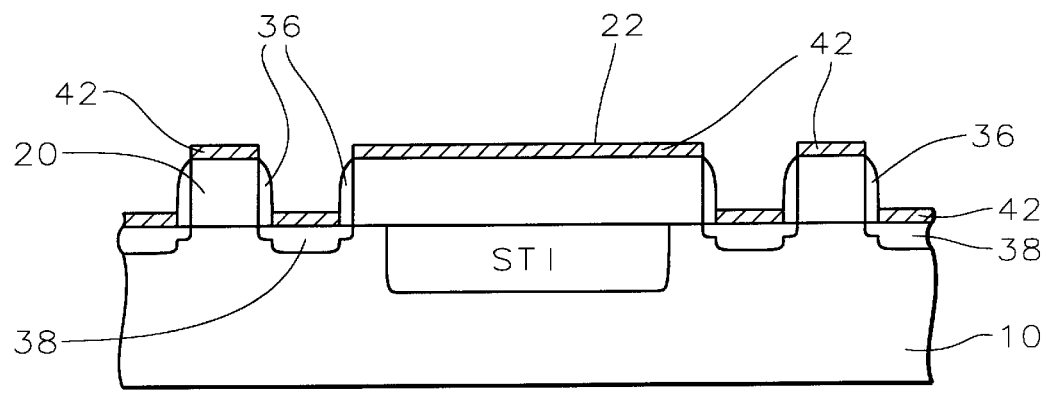
FIGS. 4 through 11 are cross-sectional representations of a first preferred embodiment of the present invention.

Now, according to a first preferred embodiment of the present invention, the gate electrodes and source/drain regions will be silicided using the conventional salicide process. Referring to FIG. 4 a layer of titanium, titanium nitride, titanium/titanium nitride, or the like, is deposited over the surface of the substrate, typically by sputtering, to a thickness of between about 200 and 500 Angstroms.

The substrate is annealed, for example, using a rapid thermal anneal (RTA) in a nitrogen ambient at a temperature of 650 to 800° C. for 10 to 30 seconds. The titanium layer reacts with the silicon in the substrate in the source and drain regions 38 and with the polysilicon in the gate electrodes 20 and 22 to form titanium silicide 42. The titanium overlying the silicon nitride sidewalls 36 is unreacted. The unreacted titanium is removed, leaving the salicided gate electrodes 20 and 22 and source and drain regions 38, as shown in FIG. 4.

Figure 5:
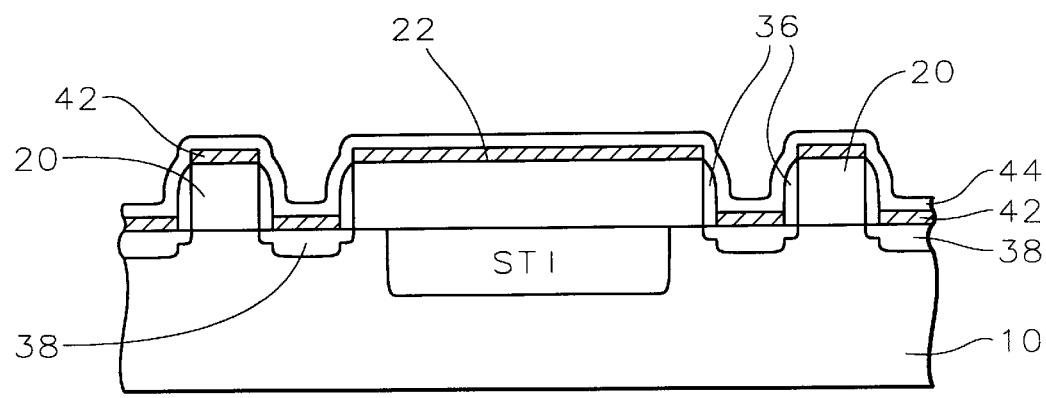

This completes the salicide process. Now, the self-aligned contact process of the present invention will be described. Referring now to FIG. 5, a liner silicon nitride layer 46 is conformally deposited over the surface of the substrate to a thickness of between about 300 and 1000 Angstroms.

Figure 6:
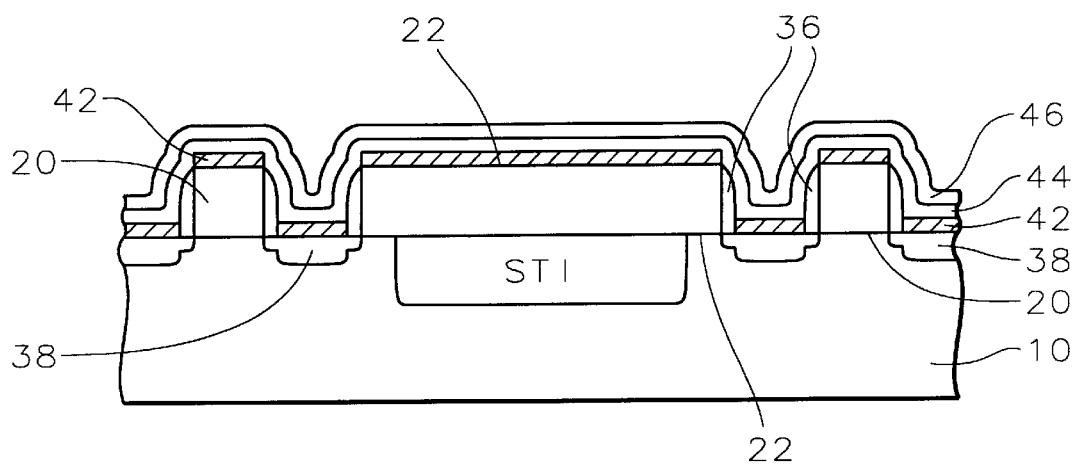

FIG. 6 shows an alternative liner which has a first layer of silicon dioxide 44 having a thickness of between about 100 and 600 Angstroms and a second layer of silicon nitride 46 having a thickness of between about 300 and 1000 Angstroms. Further processing is illustrated using the double liner layer, but it is to be understood that either the single or double liner layer can be used in the process of the invention.

Figure 7:
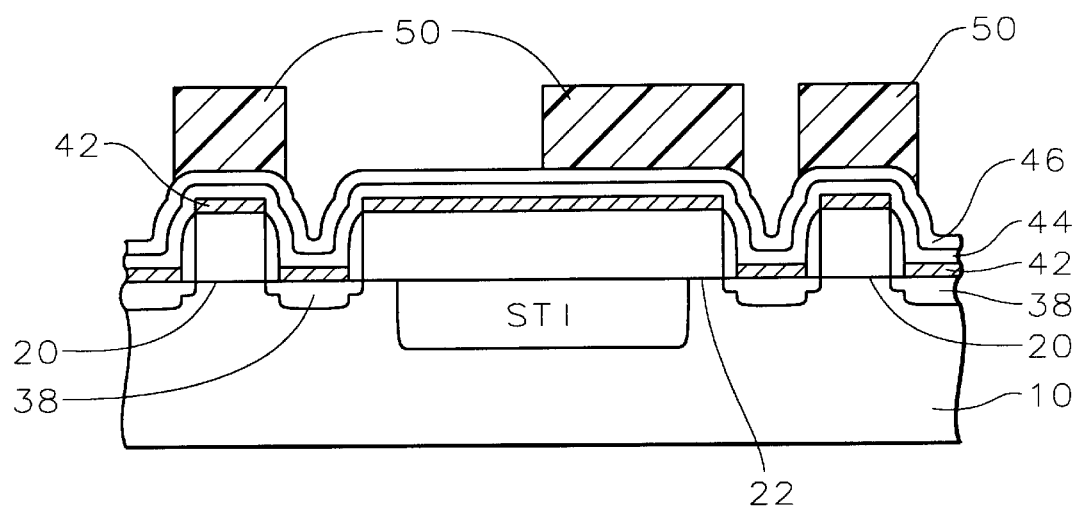

Referring now to FIG. 7, a poly cap photomask 50 is formed over the substrate. The mask provides openings for the self-aligned contact, butting contact, and gate contacts. The design rule of this mask must take care of the misalignment tolerance to the gate polysilicon in order to have full coverage of the gate polysilicon under the SAC region. The poly-cap layer 46 on top of the polysilicon for the butting contacts and the gate contacts must be removed.

Figure 8:
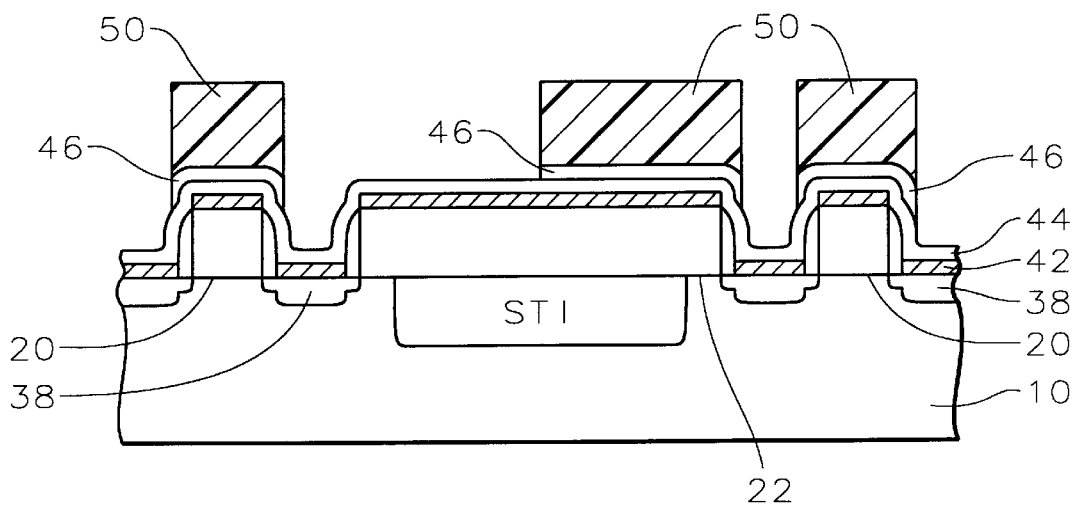

The silicon nitride liner layer (or poly-cap layer) 46 is etched away where it is not covered by the mask 50, as shown in FIG. 8.

Figure 9:
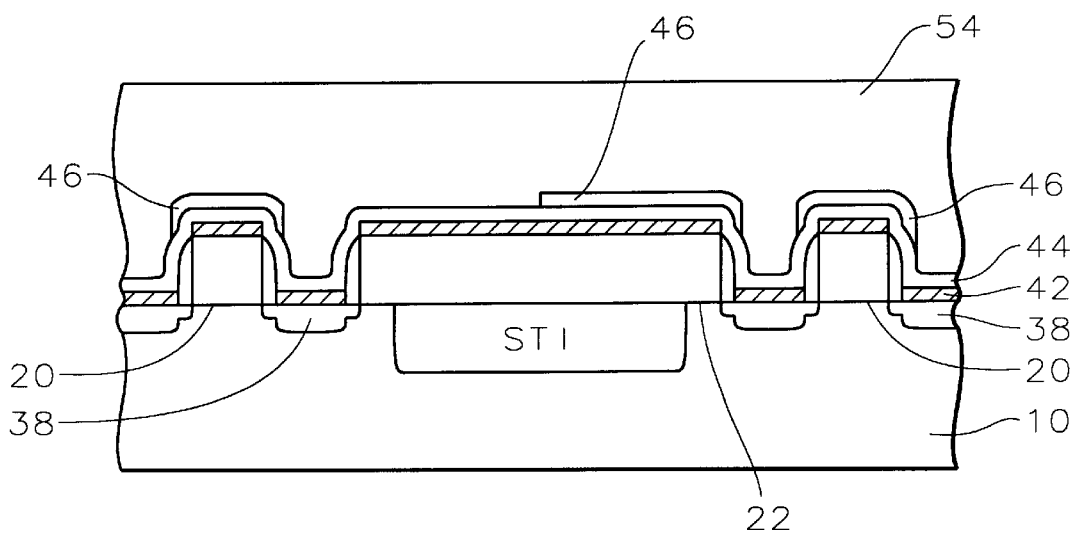

Now, the photoresist mask 50 is removed and a dielectric layer, such as borophosphosilicate glass (BPSG) 54 or the like is deposited over the substrate and planarized by reflow or other methods conventional in the art and as illustrated in FIG. 9.

A contact photomask, not shown, is formed over the substrate. The BPSG 54 and silicon dioxide layer 44 are etched away where they are not covered by the contact mask to open the self-aligned contact 60, the butting contact 62, and the gate contacts and normal diffusion contacts (not shown). All of these contacts can be opened simultaneously. The contact etch will need to have high etch selectivity between BPSG and the liner nitride in order to prevent shortage between the contact to the gate polysilicon while maintaining high etch selectivity to silicon. Selectivity of BPSG to the poly-cap layer 46 should be greater than about 15. Selectivity of BPSG to silicon should be between about 30 and 100.

Since the liner nitride has already been removed from the butting contact opening 62 and the gate contact regions (not shown), those contacts are formed in the same process steps without the need for an additional masking process. The silicon nitride liner layer 46 forms the narrowed self-aligned contact with zero spacing between the SAC contact to the gate polysilicon.

Figure 11:
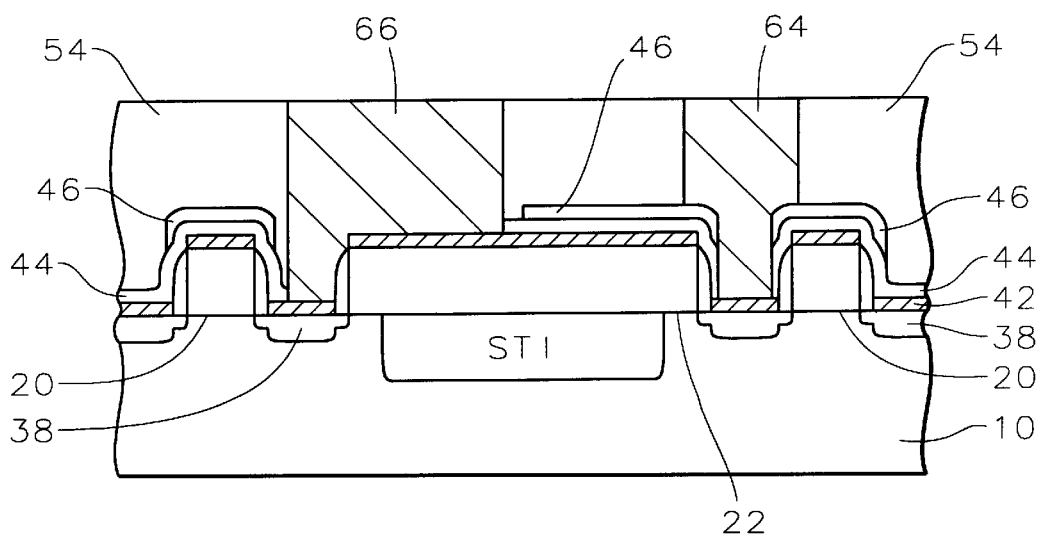

FIG. 11 illustrates the completion of the SAC contact 64 and the butting contact 66 with the filling of the contact opening with a metal layer, such as tungsten plugs as shown.

Figure 10:
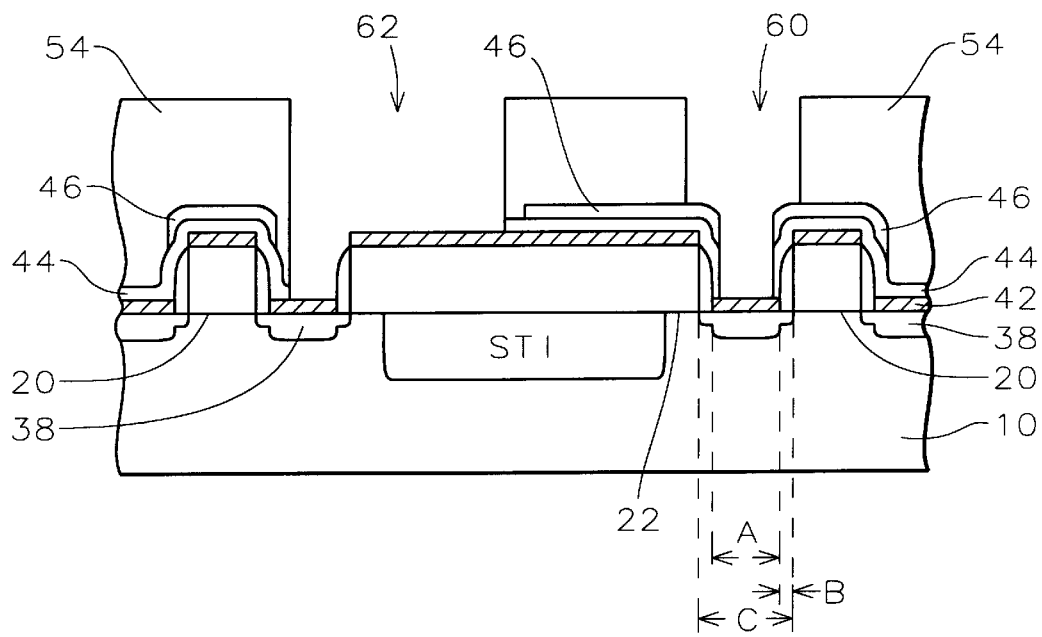

In order for the process of the invention to be manufacturable, the design rule of the poly-cap liner layer 46 must give careful consideration to the misalignment tolerance of the stepper, gate critical dimension variations, and rounding effect. As illustrated in FIG. 10, in the ideal case, the spacing rule of the poly-cap mask, $Sp_{cap}$ (spacing A), is determined by the poly gate spacing ($Sp_{poly}$, spacing C) between the self-aligned contact and the poly-cap overlap of the gate poly ($W_{olp}$, spacing B).

$$Sp_{cap} = Sp_{poly} - 2 \times W_{olp},$$

or $$Sp_{poly} = Sp_{cap} = 2 \times W_{olp}.$$

Given a certain number for $W_{olp}$ in order to maintain process manufacturability, $Sp_{poly}$ will be governed by the stepper capability of line to line spacing. This spacing also determines the effective SAC contact width between the two poly gates.

The inventors have designed a static random access memory (SRAM) cell using the technology of the present invention. By using the 0.25 μm design rule, the cell size is 2.28×3.0=6.84 μm². By using the SAC process of the invention, we can achieve a cell size of close to 30% smaller than the size of a cell designed without the SAC process of the invention.

Figure 12:
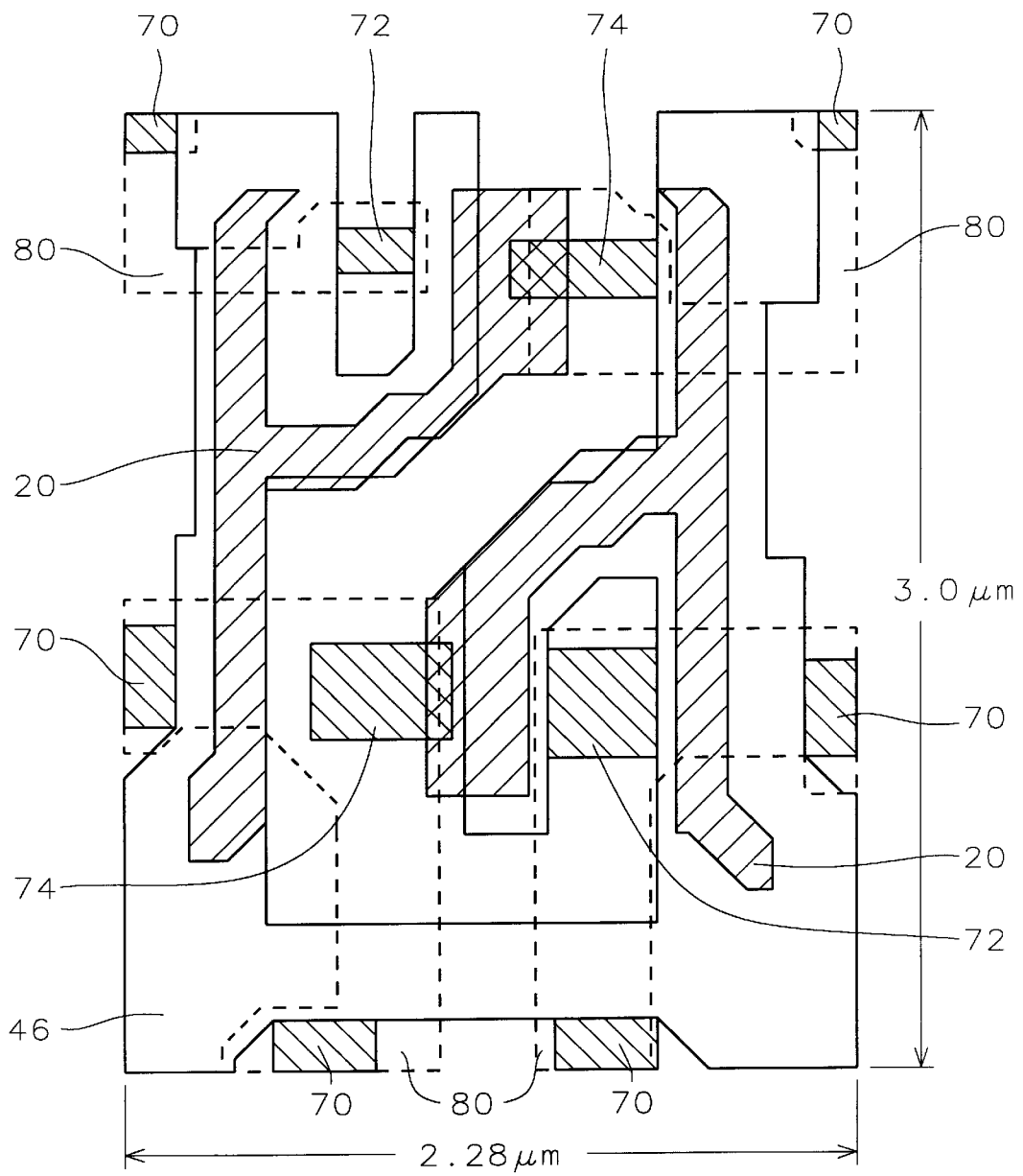
FIG. 12 is a top view representation of a SRAM device designed according to the process of the present invention.

The SRAM cell designed by the inventors is illustrated in top view in FIG. 12. Active areas 80 are shown. Polysilicon lines 20 are shown partially covered by the poly-cap layer 46. Contacts 70 are partial SAC contacts, 72 are full SAC contacts, and contacts 74 are butted contacts.

Figure 13:
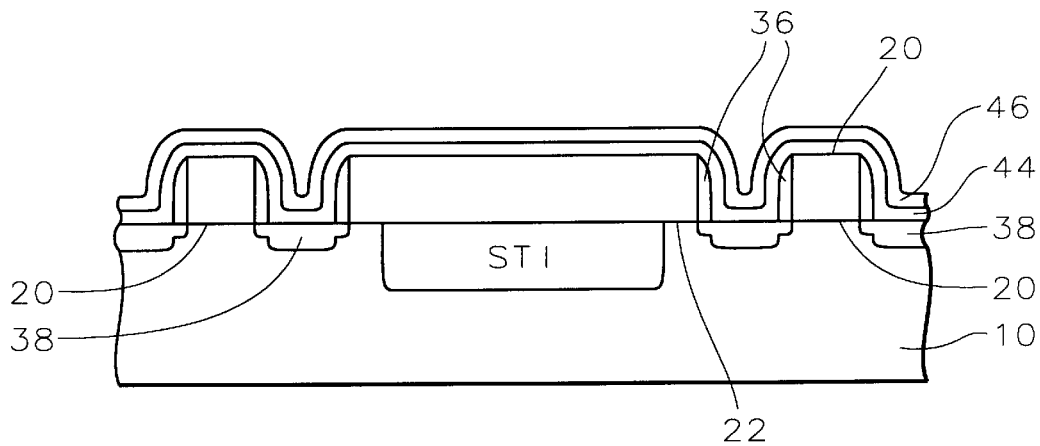
FIGS. 13 through 16 are cross-sectional representations of a second preferred embodiment of the present invention.

The second preferred embodiment of the invention uses the SAC process of the invention in a non-salicide process. After gate electrodes and source/drain regions have been formed as described with reference to FIGS. 1–3 above, the poly-cap liner layer is deposited over the substrate, as shown in FIG. 13. In this embodiment, the poly-cap layer is a dual layer. The first layer is silicon dioxide 44 having a thickness of between about 100 and 600 Angstroms. The second layer is silicon nitride or polysilicon 46 having a thickness of between about 300 and 1000 Angstroms.

Figure 14:
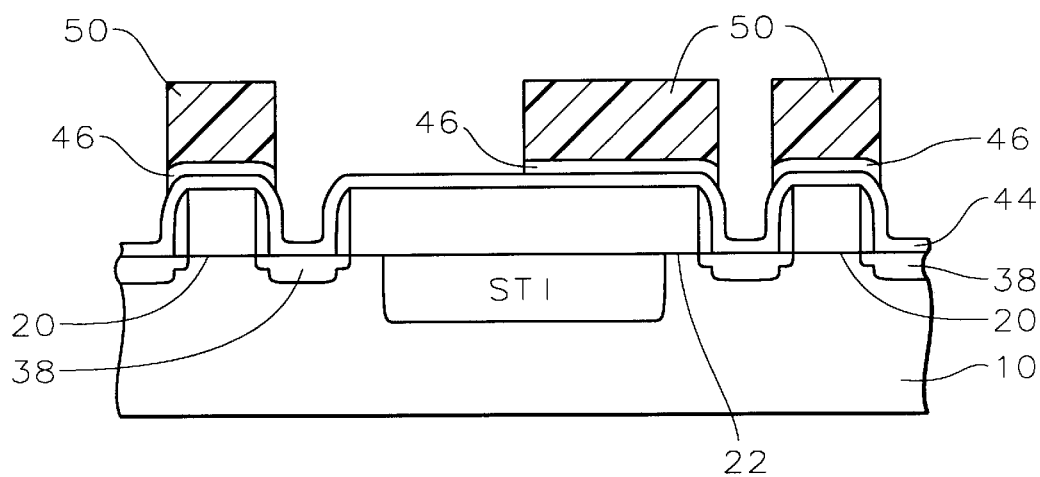

Referring now to FIG. 14, a poly cap photomask 50 is formed over the substrate. The mask provides openings for the self-aligned contact, butting contact, and gate contacts. The design rule of this mask must take care of the misalignment tolerance to the gate polysilicon in order to have full coverage of the gate polysilicon under the SAC region. The poly-cap layer 46 on top of the polysilicon for the butting contacts and the gate contacts is etched away where it is not covered by the mask 50.

Figure 15:
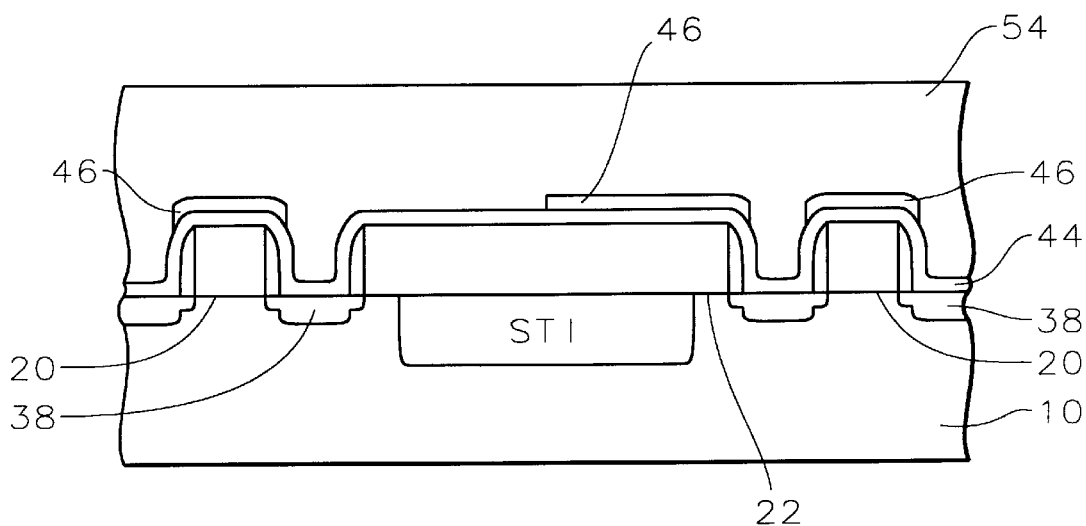

Now, the photoresist mask 50 is removed and a dielectric layer, such as borophosphosilicate glass (BPSG) 54 or the like is deposited over the substrate and planarized by reflow or other methods conventional in the art and as illustrated in FIG. 15.

A contact photomask, not shown, is formed over the substrate. The BPSG 54 and silicon dioxide layer 44 are etched away where they are not covered by the contact mask to open the self-aligned contact 60, the butting contact 62, and the gate contacts and normal diffusion contacts (not shown), as detailed hereinabove in the first embodiment of the invention. Selectivity of BPSG to the poly-cap layer 46, whether it comprises silicon nitride or polysilicon, should be greater than about 15. Selectivity of BPSG to silicon should be between about 30 and 100.

Figure 16:
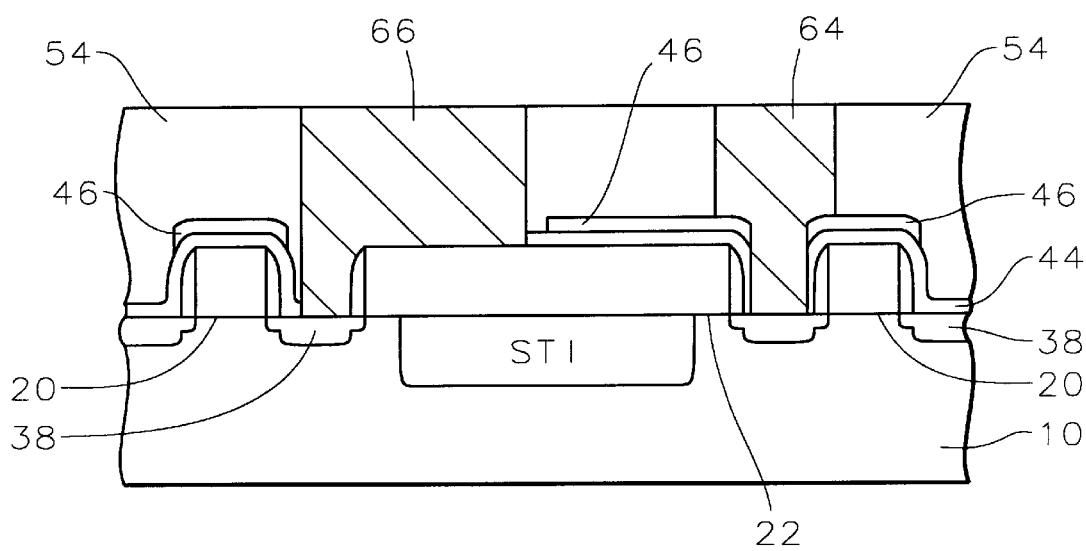

FIG. 16 illustrates the completion of the SAC contact 64 and the butting contact 66 with the filling of the contact opening with a metal layer, such as tungsten plugs as shown.

The process of the present invention integrates the salicide process for logic circuits with the self-aligned contact process for memory circuits so that memory and logic devices can be fabricated together on the same wafer. The poly-cap masking process of the present invention allows the self-aligned contact process to be easily plugged into the standard salicide logic process. The inventive process can form simultaneously a self-aligned contact and a butted contact as well as gate and diffusion contacts in the fabrication of an integrated circuit device. Salicide and self-aligned contact processes are integrated successfully on one chip without any impact on device performance.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming isolation areas on a semiconductor substrate surrounding and electrically isolating device areas;

providing a gate oxide layer overlying said semiconductor substrate in said device areas;

depositing a first polysilicon layer overlying said gate oxide layer and said isolation areas;

patterning said first polysilicon layer to form gate electrodes;

implanting first ions to form lightly doped source and drain regions within said semiconductor substrate associated with said gate electrodes;

forming silicon nitride spacers on the sidewalls of said gate electrodes;

implanting second ions to form heavily doped source and drain regions within said semiconductor substrate associated with said gate electrodes;

depositing a poly-cap layer overlying said substrate including said gate electrodes and source and drain regions;

selectively removing said poly-cap layer overlying one of said source and drain regions where a self-aligned contact is to be formed, and overlying another of said source and drain regions and a portion of its associated gate electrode where a butted contact is to be formed;

thereafter depositing an insulating layer over the surface of said semiconductor substrate;

simultaneously etching said planned self-aligned contact opening and said planned butted contact opening through said insulating layer; and filling said self-aligned contact opening and said butted contact opening with a conducting layer to complete the fabrication of said integrated circuit device.

2. The method according to claim 1 before said step of depositing said poly-cap layer further comprising:

depositing a metal layer over said gate electrodes and said semiconductor substrate;

annealing said semiconductor substrate whereby said metal layer is transformed into a metal silicide layer over said gate electrodes and over said heavily doped source and drain regions associated with said gate electrodes; and removing said metal layer which is not transformed into metal silicide overlying said spacers to leave said metal silicide layer only on the top surface of said gate electrodes and on the top surface of said semiconductor substrate overlying said heavily doped source and drain regions associated with said gate electrodes resulting in salicided gate electrodes and salicided source and drain regions.

3. The method according to claim 2 wherein said metal layer comprises titanium and wherein said metal silicide layer comprises titanium silicide.

4. The method according to claim 1 wherein said poly-cap layer comprises silicon nitride having a thickness of between about 300 and 1000 Angstroms.

5. The method according to claim 1 wherein said poly-cap layer comprises a first layer of silicon dioxide having a thickness of between about 100 and 600 Angstroms and a second layer of silicon nitride having a thickness of between about 300 and 1000 Angstroms.

6. The method according to claim 2 wherein said poly-cap layer comprises a first layer of silicon dioxide having a thickness of between about 100 and 600 Angstroms and a second layer of silicon nitride having a thickness of between about 300 and 1000 Angstroms.

7. The method according to claim 1 wherein said poly-cap layer comprises a first layer of silicon dioxide having a thickness of between about 100 and 600 Angstroms and a second layer of polysilicon having a thickness of between about 300 and 1000 Angstroms.

8. The method according to claim 1 wherein said insulating layer comprises borophosphosilicate glass.

9. The method according to claim 1 wherein said conducting layer comprises tungsten.

10. A method of fabricating an integrated circuit device comprising:

forming isolation areas on a semiconductor substrate surrounding and electrically isolating device areas;

providing a gate oxide layer overlying said semiconductor substrate in said device areas;

depositing a first polysilicon layer overlying said gate oxide layer and said isolation areas;

patterning said first polysilicon layer to form gate electrodes;

implanting first ions to form lightly doped source and drain regions within said semiconductor substrate associated with said gate electrodes;

forming silicon nitride spacers on the sidewalls of sad gate electrodes;

implanting second ions to form heavily doped source and drain regions within said semiconductor substrate associated with said gate electrodes;

depositing a metal layer over gate electrodes and said semiconductor substrate;

annealing said semiconductor substrate whereby said metal layer is transformed into a metal silicide layer over said gate electrodes and over said heavily doped source and drain regions associated with said gate electrodes;

removing said metal layer which is not transformed into metal silicide overlying said spacers to leave said metal silicide layer only on the top surface of said gate electrodes and on the top surface of said semiconductor substrate overlying said heavily doped source and drain regions associated with said gate electrodes resulting in salicided gate electrodes and salicided source and drain regions;

depositing a poly-cap layer overlying said substrate including said salicided gate electrodes and source and drain regions;

selectively removing said poly-cap layer overlying one of said salicided source and drain regions where a self-aligned contact is to be formed, and overlying another of said salicided source and drain regions and a portion of its associated salicided gate electrode where a butted contact is to be formed;

thereafter depositing an insulating layer over the surface of said semiconductor substrate;

simultaneously etching said planned self-aligned contact opening and said planned butted contact opening through said insulating layer; and filling said self-aligned contact opening and said butted contact opening with a conducting layer to complete the fabrication of said integrated circuit device.

11. The method according to claim 10 wherein said metal layer comprises titanium and wherein said metal silicide layer comprises titanium silicide.

12. The method according to claim 10 wherein said poly-cap layer comprises silicon nitride having a thickness of between about 300 and 1000 Angstroms.

13. The method according to claim 10 wherein said poly-cap layer comprises a first layer of silicon dioxide having a thickness of between about 100 and 600 Angstroms and a second layer of silicon nitride having a thickness of between about 300 and 1000 Angstroms.

14. The method according to claim 10 wherein said insulating layer comprises borophosphosilicate glass.

15. The method according to claim 10 wherein said conducting layer comprises tungsten.

16. A method of fabricating an integrated circuit device comprising:

forming isolation areas on a silicon semiconductor substrate surrounding and electrically isolating device areas;

forming gate electrodes and associated source and drain regions on and in said semiconductor substrate wherein said gate electrodes have silicon nitride sidewall spacers;

forming a metal silicide layer on the top surface of said gate electrodes and on the top surface of said semiconductor substrate overlying said source and drain regions associated with said gate electrodes resulting in salicided gate electrodes and salicided source and drain regions;

depositing a poly-cap layer overlying said substrate including said salicided gate electrodes and source and drain regions;

selectively removing said poly-cap layer overlying one of said salicided source and drain regions where a self-aligned contact is to be formed, and overlying another of said salicided source and drain regions and a portion of its associated salicided gate electrode where a butted contact is to be formed;

thereafter depositing an insulating layer over the surface of said semiconductor substrate;

etching through said insulating layer to form simultaneously said planned self-aligned contact opening and said planned butted contact opening wherein said etching has a high selectivity between said insulating layer and said poly-cap layer and a high selectivity between said insulating layer and said silicon substrate; and filling said self-aligned contact opening and said butted contact opening with a conducting layer to complete the fabrication of said integrated circuit device.

17. The method according to claim 16 said metal silicide layer comprises titanium silicide.

18. The method according to claim 16 wherein said poly-cap layer comprises silicon nitride having a thickness of between about 300 and 1000 Angstroms.

19. The method according to claim 16 wherein said poly-cap layer comprises a first layer of silicon dioxide having a thickness of between about 100 and 600 Angstroms and a second layer of silicon nitride having a thickness of between about 300 and 1000 Angstroms.

20. The method according to claim 16 wherein said insulating layer comprises borophosphosilicate glass.

* * * * *